United States Patent [19]

Broer

[11] Patent Number: 4,892,392
[45] Date of Patent: Jan. 9, 1990

[54] PICTURE DISPLAY CELL AND METHOD OF FORMING AN ORIENTATION LAYER ON A SUBSTRATE OF THE PICTURE DISPLAY CELL

[75] Inventor: Dirk J. Broer, Eindhoven, Netherlands

[73] Assignee: U.S. Philips Corporation, New York, N.Y.

[21] Appl. No.: 267,694

[22] Filed: Nov. 2, 1988

Related U.S. Application Data

[63] Continuation of Ser. No. 92,253, Sep. 1, 1987, abandoned.

[30] Foreign Application Priority Data

Sep. 4, 1986 [NL] Netherlands .......................... 8602235

[51] Int. Cl.[4] .......................... G02F 1/13; B05D 3/06; C09K 19/00
[52] U.S. Cl. .............................. 350/339 R; 350/340; 350/341; 427/54.1; 428/1
[58] Field of Search .................... 427/54.1; 350/339 R, 350/341, 340; 428/1

[56] References Cited

U.S. PATENT DOCUMENTS

| | | | |
|---|---|---|---|
| 3,989,354 | 11/1976 | Dubois et al. | 350/340 |
| 4,022,934 | 5/1977 | Miller | 427/58 |
| 4,038,441 | 7/1977 | Dubois | 427/109 |
| 4,293,435 | 10/1981 | Portugall et al. | 428/1 |
| 4,561,725 | 12/1985 | Hotta | 350/339 F |
| 4,615,962 | 10/1986 | Garito | 427/53.1 |
| 4,639,089 | 1/1987 | Okada et al. | 350/341 |
| 4,643,528 | 2/1987 | Bell, Jr. | 428/1 |
| 4,647,978 | 3/1987 | Formanek et al. | 428/1 |
| 4,683,327 | 7/1987 | Stackman | 526/325 |
| 4,707,086 | 11/1987 | Ferguson | 428/1 |
| 4,725,517 | 1/1988 | Nakanouwatari et al. | 350/340 |
| 4,735,492 | 4/1988 | Sekine et al. | 350/341 |
| 4,749,777 | 6/1988 | Kohtoh et al. | 428/1 |
| 4,767,191 | 8/1988 | Van Sprang et al. | 350/341 |
| 4,799,772 | 1/1989 | Utsumi | 350/339 R |
| 4,820,026 | 4/1989 | Okada et al. | 350/341 |

FOREIGN PATENT DOCUMENTS 2185487 7/1987 United Kingdom .

OTHER PUBLICATIONS

Portugall et al., "Makramol. Chem.", Vol. 183, pp. 2311-2321 (1982).

Primary Examiner—Norman Morgenstern
Assistant Examiner—Marianne L. Podgett
Attorney, Agent, or Firm—Norman N. Spain

[57] ABSTRACT

Picture display cell, method of forming an orientation layer on a substrate of the picture display cell and monomeric compounds for use in the orientation layer.

The picture display cell comprising two transparent plates having an electrode with thereon an orientation layer and a sealing ring between the ends of the plates, a liquid crystalline material being present in the space between the plates and the ring, the orientation layer being formed from a monomer or a low molecular compound which is first oriented in a field.

12 Claims, 3 Drawing Sheets

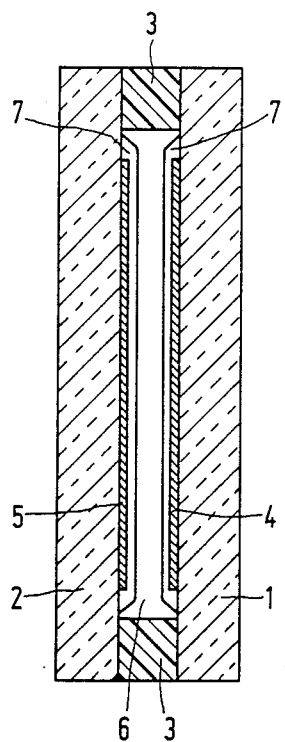
FIG.

1 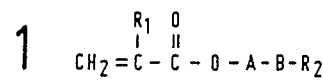
2 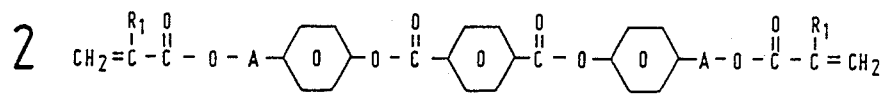
3 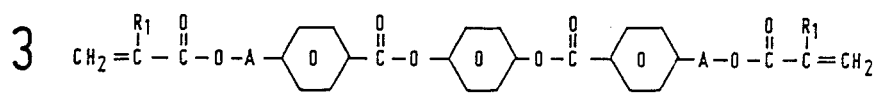
4 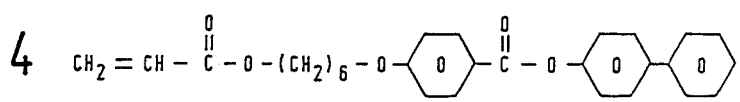
5 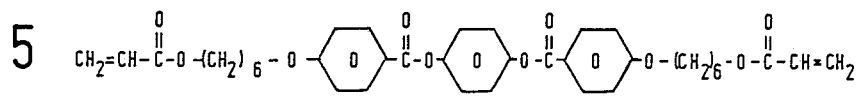
6 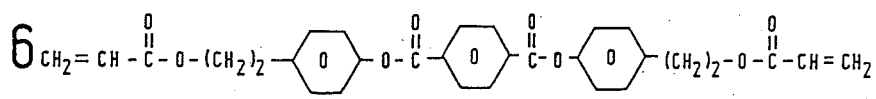
7 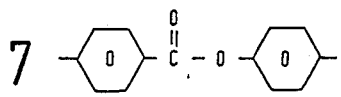    8 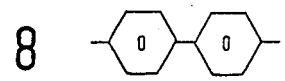
9 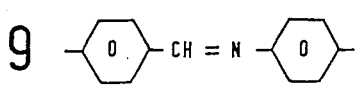    10 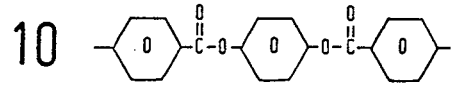
11 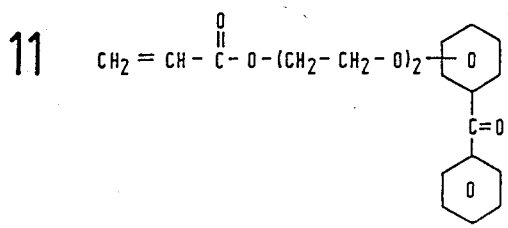

12
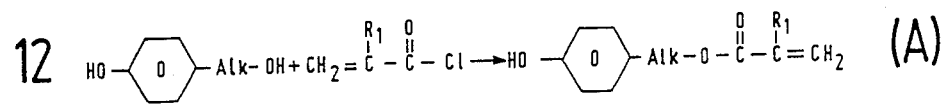 (A)
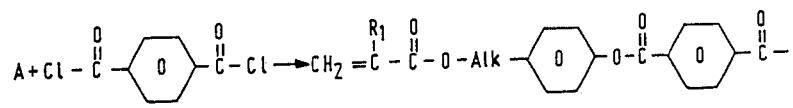
 (B)
13
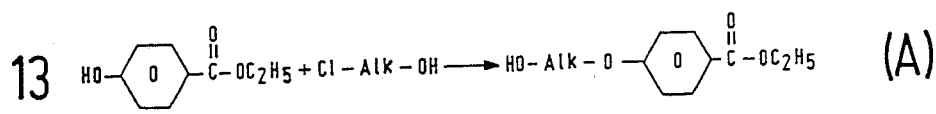 (A)
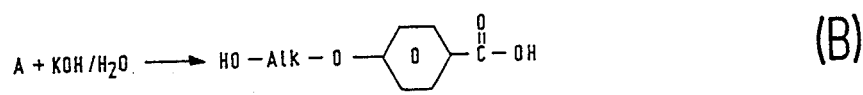 (B)
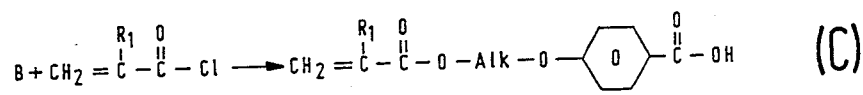 (C)
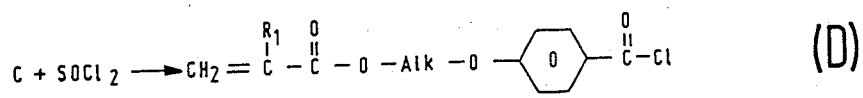 (D)
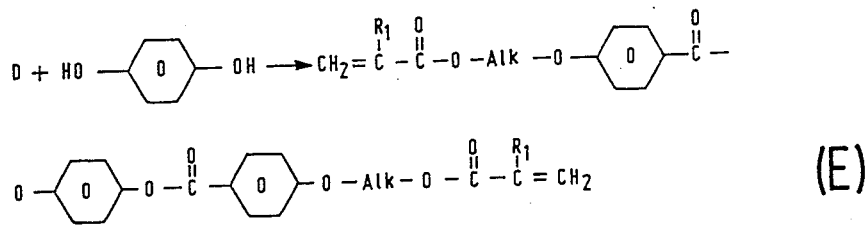
(E)

PICTURE DISPLAY CELL AND METHOD OF FORMING AN ORIENTATION LAYER ON A SUBSTRATE OF THE PICTURE DISPLAY CELL

This is a continuation of application Ser. No. 092,253, filed Sept. 1, 1987 now abandoned.

BACKGROUND OF THE INVENTION

The invention relates to a picture display cell comprising as a substrate two orthogonally relocated plates which are transparent to light and which on the facing sides comprise an electrode of a material which is transparent to light and having an orientation layer, a sealing ring positioned between the ends of the plates, a liquid crystalline material being provided in the space between the plates and the ring. The invention further relates to a method of forming an orientation layer on a substrate for the picture display cell comprising an electrode and to the materials from which the orientation layer is manufactured.

Such a picture display cell is known from U.S. Pat. No. 4,469,409 in which picture display cell an orientation layer is provided on a glass substrate, which orientation layer is formed from a film of a homogeneous mixture having a silanol oligomer modified with an aromatic ring which comprises a silane group and an organic polymer. The picture display cell of the twisted nematic type (TN-type) according to the said U.S. Patent comprises a substrate having an orientation layer 30 which can withstand elevated temperatures better and bonds more satisfactorily to the substrate in the previously used organic polymers having an imide or quinazoline ring and bonds more satisfactorily in the substrate. A method of providing a polymeric layer on a substrate is described in example 1 of this U.S. Patent in which a solution of the polymer is prepared and this solution is provided on the substrate via a spinning technique.

German Auslegeschrift 2,315,541 discloses a picture display cell in which on the substrate an orientation layer is provided by vapour deposition at reduced pressure. According to this vapour deposition technique $SiO_x$ layers are provided. More information on such layers is shown in H. A. van Sprang and R. G. Aartsen in J. Appl. Phys. 56 (2), July 15, 1984, pp. 251-262, in which article the method of providing, the measurements and the apparatus used are described.

The use of such an $SiO_x$ orientation layer in a picture display cell, however, has for a disadvantage or in that with these cells only a restricted range of solid angles for the orientation of the nematic liquid crystal material is available.

German Offenlegungschrift 3,020,645 discloses a picture display cell in which a polymeric orientation layer is provided on the substrate, which polymeric orientation layer itself is liquid crystalline. When switching on or off the voltage the liquid crystalline material and the polymeric layer are both oriented at right angles to or parallel to the substrate. The orientation layer is also in the liquid crystalline phase under operating conditions.

Japanese Patent Application Kokai No. 52-146255 discloses a picture display cell having a liquid crystalline material in which the orientation of the liquid crystalline material takes place by incorporating herein magnetic particles, for example, $-Fe_2O_3$ acicular particles which are oriented by means of a magnet, after which the temperature of the glass plates is raised so that the liquid binder at the raised temperature is made to solidify. In this manner the magnetic particles are fixed and hence also the liquid crystal material. The presence of the acicular $-Fe_2O_3$-particles in the picture display cell, however, has disadvantages because under the influence of said particles inteferences in the light permeability can easily occur.

Applicants have made further research into the orientation layer of the picture display cell and they have found that it is possible to provide a polymeric layer on the substrate, which polymeric layer can be oriented and fixed after the orientation. As specific examples of polymers that may be used are the specific materials described inter alia by R. Simon and H. J. Coles in Mol. Cryst. Liq. Cryst. Vol. 102 (Letters), pp. 43-48. This method yielded good results but had the disadvantage that it took some time, for example, 5 minutes to more than 1 hour, dependent on the polymer used, until the orientation layer had been oriented completely in an electric or magnetic field.

SUMMARY OF THE INVENTION

According to the invention Applicants have found that it is possible to considerably reduce said time necessary for the orientation, namely to even a few seconds, by forming a picture display cell according to the invention as described in the opening paragraph which is characterized in that the orientation layer is formed from a monomer or low molecular compound which is first oriented in a magnetic or electric field and is then polymerized. According to the invention, the method of forming an orientation layer on a substrate which comprises an electrode for a picture display cell is therefore characterized in that a film of a liquid crystalline monomer is provided, the monomer is oriented at a given angle in a magnetic or an electric field and is then polymerized.

BRIEF DESCRIPTION OF THE DRAWING

Present in the drawing is a FIGURE which is a cross-sectional view of a display wall of the invention and a formula sheet.

DETAILED DESCRIPTION OF THE INVENTION

The invention will now be described in greater detail with reference to the ensuing description and the drawing, the FIGURE of which is cross-sectional view of a picture display cell according to the invention and the formula sheet.

Reference numerals 1 and 2 in the FIGURE denote two oppositely relocated plates which are transparent to light and which are hereinafter referred to as substrates and which on the facing sides comprise electrodes 4 and 5, for example, manufactured of $In_2O_3$-$SnO_2$. An orientation layer 7 with which preferably nematic liquid crystals 6 can be oriented is provided on the facing sides of these electrodes. The cell is formed by placing the substrates thus formed with electrodes and orientation layer opposite to each other and sealing the aperture by means of a ring and filling the space between the substrates and the ring 3 with the liquid crystalline material 6. In practice, a layer of adhesive of an epoxy compound is often used as the ring 3.

Essentially the invention resides in the fact that a liquid crystalline monomer is provided on a substrate and is oriented in an electric or magnetic field after the liquid crystalline monomer has been provided in a liquid crystalline phase and after the orientation the monomer is polymerized, possibly by exposure to actinic light. Another method is to heat the monomer up to a temperature above the nematic-isotropic transition state and then cool it in the field down to a temperature at which the monomer is again liquid crystalline, after which the polymerization is carried out. Dependent on the angle of the optical axis of the nematic groups the polymer layer induces tilted orientation in the subsequently provided liquid crystal material.

More in particular it has been found that, the orientation layer, may be started from a liquid film of a crystalline (meth)acrylate monomer. This monomer can be dissolved and the resulting solution can then be provided on the substrate in the form of a thin film according to a known spinning technique. A suitable group of liquid crystalline acrylate monomers is represented by formula 1 of the formula sheet, in which formula —A— is a bivalent radical, for example, $(CH_2)_x$, $(CH_2)_xO$, $(Si(CH_3)_2—O)_x$, wherein $x=1-15$ and $(CH_2—CH_2—O)_y$, wherein $y=1$ to $8$ and —B— is a mesogenic group, for example, a group of formulae 7, 8, 9 or 10, and in which formula 1 $R_1$ is H or $CH_3$ and R2 is an alkyl group a liquid crystal forming group as shown in Kirk, Arthur, Encyclopedia of Chemical Technology 3rd Edition volume 14, 1971, John Wiley & Sons, New York, pp. 395, 396, an aromatic ring, a cyano group or combination hereof. An useful example of such an acrylate monomer is represented by the formula 4 of the formula sheet.

In a preferred embodiment of the picture display cell according to the invention the liquid crystalline meth(acrylate)monomer corresponds to the formulae 2 and 3 of the formula sheet. The monomers of the formulae 2 and 3 are diacrylates which upon polymerization form a cross-linked structure.

The monomers of formulae 2 and 3 are novel products. The invention also relates to these novel products. The monomers of formula 2 can be prepared by a chemical process represented by reaction scheme 12 of the formula sheet. The monomers of formula 3 can be manufactured according to the reaction scheme 13 of the formula sheet. The several reactions are, as usual, performed in the presence of inert organic solvents such as ketones, ethers or hydrocarbons. The reaction A and B of scheme 12 are performed in the presence of an amine, particularly a mixture (10:1) of triethyamine and 1-dimethylamino-pyridine. The reaction A of scheme 13 is performed in the presence of NaOH and NaI. The reactions C and E of scheme 13 are performed in the presence of an amine as denoted above for scheme 12. In schemes 12 and 13, $R_1$ has the meaning disclosed hereinbefore and Alk stands for an alkylene group.

Useful examples of the diacrylate monomers are given by the formulae 5 and 6 of the formula sheet.

For the orientation of the mesogenic groups of the monomer in the electric or the magnetic field, the monomer must be to the liquid crystalline phase, which is possible by raising the temperature. For the acrylate of formula 4, shown on the formula sheet, the transition from the crystalline to the nematic state takes place at 89° C. and from the nematic to the isotropic state at 98,5° C. upon heating the monomer, while upon cooling the transition from the isotropic state to the nematic state takes place at 98° C., the transition from the nematic to the smectic state at 78° C. and from the smectic state to the crystalline state at 49° C. This means that the orientation and the in situ polymerization preferably take place at a temperature of 89°–98° C. dependent on the desired state of the orientation layer.

For the acrylate monomer shown in the formula sheet by formula 5, the transition in a heating cycle from the crystalline to the smectic state takes place at 17° C. and from smectic to the nematic state at 93° C. and from nematic to the isotropic state at 193° C. Therefore, the orientation for the monomer of formula 4 will take place at a temperature between 77° and 153° C.

The compound of the formula 6 shows a transition from the crystalline to the nematic at 129° C. and from the nematic state to the isotropic at 149° C.

The temperature at which the orientation of the monomer, notably the mesogenic group, has to be carried out may be reduced by using a mixture of monomers in which not only the orientation takes place separately but can also take place at a comparatively low temperature, possibly at the ambient temperature. A further modification is the use of a mixture of a polymer in a monomer in which the polymer may be constructed from other monomers than the monomer which is used here as a solvent.

The polymerization of the oriented monomer preferably takes place by exposure to actinic light, notably by exposure to UV-light. The polymerization can be accelerated by adding to the acrylate monomers a small quantity, preferably less than 10% by weight, of a photoinitiator. The polymerization preferably takes place while excluding oxygen. As a result of the polymerization the orientation of the mesogenic groups is fixed so that said anisotropy is maintained within a wide temperature range.

The photoinitiators to be used are known an example of which is is Irgacure 651 (trademark of CIBA-Geigy).

It may be advantageous not to provide the film of the monomer directly on the substrate material but first to provide the substrate material with a bonding layer which may consist of a -methacryloxypropyl trimethoxysilane or -aminopropylsilane. Another embodiment which is to be preferred is to carry out the polymerization in the presence of a photoinitiator which, however, is not mixed with the monomer but which photoinitiator is bound to the surface so that no changes of the liquid crystalline properties of the monomer are obtained in that it is mixed with the non-liquid crystalline photoinitiator and moreover the polymerization then takes place from the surface and the polymer chains are bound to the surface. In this manner it is prevented that the polymer is optionally dissolved in the liquid crystalline material 6 of the display cell.

The photo initiator may be bound to the surface by first providing the substrate, according to a known method, with a layer of an -aminopropylsilane, after which the substrate is immersed in a solution of a photo initiator in THF (tetrahydrofuran), for which purpose a 5% solution of the photoinitiator of formula 9 may be used. At the ambient temperature reaction takes place between the -aminopropylsilane and the compound of formula 9, so that the substrate is provided with a surface film of a material which comprises both an amino group and a benzophenone group, which amino group has an accelerating effect on the photoinitiator of the benzophenone group.

If the actinic radiation is carried out with electron radiation it is not necessary to use an initiator. When the orientation of the mesogenic group in the monomer has to be carried out at a comparatively high temperature, the disadvantage of this is that at the said comparatively high temperature the possibility of polymerization rather occurs so that it is to be preferred to perform the orientation at a comparatively low temperature and then to freeze the oriented monomeric groups by polymerization.

What is claimed is:

1. A picture display cell comprising as a substrate two oppositely located plates which are transparent to light and which on the facing sides comprise an electrode of a material which is transparent to light having thereon an orientation layer and a sealing ring between the ends of the plate, a liquid crystalline material being provided in the space between the plates and the ring, characterized in that the orientation layer is formed from a monomer or a low molecular weight compound which is first oriented at a given angle essentially only in an electric or magnetic field and is then polymerized.

2. A picture display cell as claimed in claim 1, characterized in that the orientation layer is built up from a polymer obtained by the polymerization of oriented liquid crystalline (meth)acrylate monomers.

3. A picture display cell as claimed in claims 1 or 2, characterized in that the monomers are acrylate monomers which correspond to formula 1, 2 or 3 of the formula sheet, wherein —A— is a bivalent radical, —B— is a mesogenic group, R is hydrogen atom or a methyl group and $R_2$ is an alkyl group, an aromatic group, a cyano group or combinations thereof.

4. A picture display cell as claimed in claim 3, characterized in that the acrylate monomers correspond to formula 4, 5 or 6 of the formula sheet.

5. A picture display cell as claimed in claims 1 or 2, characterized in that the orientation layer is formed from a mixture of two or more monomers which are polymerized.

6. A method of forming an orientation layer on a substrate for a picture display cell comprising an electrode, characterized in that a film of a liquid crystalline monomer is provided in the substrate, the monomer is oriented essentially in a magnetic or electric field at a given angle, and is then polymerized.

7. A method as claimed in claim 6, characterized in that the polymerization is carried out by exposure to actinic light.

8. A method as claimed in claims 6 or 7, characterized in that a photo initiator is added to a monomer in a quantity smaller than 10% by weight calculated on the monomer.

9. A method as claimed in claim 6 or 7, characterized in that monomers are used as stated in claim 6.

10. A method as claimed in claim 6 or 7, characterized in that a bonding layer is formed on the substrate before the monomeric film is provided.

11. A method as claimed in claim 8, characterized in that the photoinitiator is bonded to the surface of the substrate and is not mixed in the monomer.

12. A method as claimed in claim 11, characterized in that the substrate is provided with a bonding agent, then with a photoinitiator, after which a monomeric film is provided and after orientation the polymerization of the monomeric film is carried out under the influence of UV-rays.

* * * * *